(12) United States Patent
Wegmann

(10) Patent No.: US 8,199,333 B2
(45) Date of Patent: Jun. 12, 2012

(54) OPTICAL SCATTERING DISK, USE THEREOF, AND WAVEFRONT MEASURING APPARATUS

(75) Inventor: Ulrich Wegmann, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1042 days.

(21) Appl. No.: 11/915,705

(22) PCT Filed: May 23, 2006

(86) PCT No.: PCT/EP2006/004874
§ 371 (c)(1),
(2), (4) Date: May 5, 2008

(87) PCT Pub. No.: WO2006/125600
PCT Pub. Date: Nov. 30, 2006

(65) Prior Publication Data
US 2009/0051927 A1   Feb. 26, 2009

Related U.S. Application Data

(60) Provisional application No. 60/684,977, filed on May 27, 2005.

(51) Int. Cl.
*G01B 9/02* (2006.01)
(52) U.S. Cl. .......... 356/515; 359/599; 359/577
(58) Field of Classification Search .......... 359/452, 359/599, 615; 356/515
See application file for complete search history.

(56) References Cited

U.S. PATENT DOCUMENTS

| | | | |
|---|---|---|---|
| 4,948,253 A | 8/1990 | Biegen | |
| 5,442,254 A * | 8/1995 | Jaskie | 313/485 |
| 5,733,458 A | 3/1998 | Kitazawa et al. | |
| 6,225,971 B1 | 5/2001 | Gordon et al. | |
| 6,747,796 B1 * | 6/2004 | Dorling | 359/452 |
| 7,259,827 B2 * | 8/2007 | Dierichs | 355/30 |
| 2001/0033913 A1 | 10/2001 | Murata et al. | |
| 2003/0068836 A1 | 4/2003 | Hongo et al. | |
| 2003/0072046 A1 | 4/2003 | Naulleau | |
| 2004/0014834 A1 | 1/2004 | Shiiki et al. | |
| 2004/0150874 A1 | 8/2004 | Suzuki | |
| 2005/0002102 A1 | 1/2005 | Wegmann et al. | |

FOREIGN PATENT DOCUMENTS

| | | |
|---|---|---|
| DE | 39 36 118 A1 | 5/1990 |
| DE | 103 20 520 A1 | 11/2004 |
| EP | 1 524 558 A | 4/2005 |

\* cited by examiner

*Primary Examiner* — Hwa Lee
(74) *Attorney, Agent, or Firm* — Sughrue Mion, PLLC

(57) ABSTRACT

Optical scattering disk, use and wavefront measuring apparatus. The optical scattering disk includes a transparent substrate (1) and a light scattering layer (2) adjoining a surface of the substrate and having light-scattering-active particles (3). The light scattering layer has an embedding medium (4) which is optically denser than air and directly adjoins the facing surface of the substrate without intervening air gaps and by which the light-scattering-active particles are surrounded. Such optical scattering disks may be used, e.g., in apparatuses for wavefront measurement of high-aperture microlithography projection objectives employing lateral shearing interferometry.

23 Claims, 2 Drawing Sheets

OPTICAL SCATTERING DISK, USE THEREOF, AND WAVEFRONT MEASURING APPARATUS

Figure 1:
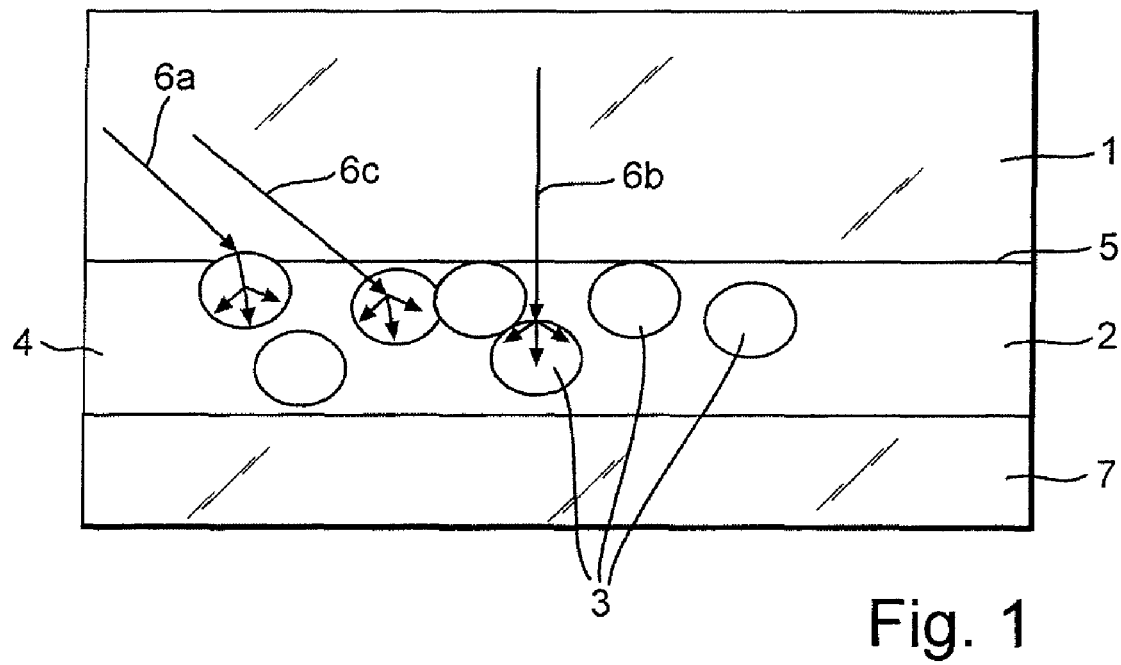

This is a National Stage Application of International Application No. PCT/EP2006/004874, filed May 23, 2006, which claims the benefit of U.S. Provisional Application No. 60/684,977, filed May 27, 2005.

The invention relates to an optical scattering disk comprising a transparent substrate and a light scattering layer adjoining a surface of the substrate, said light scattering layer comprising light-scattering-active particles, to a use of such a scattering disk and to a wavefront measuring apparatus comprising such a scattering disk. This application claims priority of U.S. provisional application no. 60/684,977 the disclosure of which is herewith fully incorporated into the present application by reference.

Optical scattering disks are conventionally usually realized as—roughened on one or both sides—plane disks or shaped surfaces made from transparent solid materials. They serve e.g. as ground-glass disks for generating real images on a screen. By virtue of the scattering effect of the scattering disk, projected images can be viewed at different viewing angles. In illumination technology, ground-glass disks serve for homogenizing the illumination of an object. In optical metrology, scattering disks also serve as phase mixers for destroying spatial coherence. Especially in interferometer measuring apparatuses, a rotating and/or oscillating movement of such scattering disk elements may additionally be provided in order to vary and intermix the phases of speckles such that they average out to zero contrast over the exposure time of an associated detector and thus no longer disturb the measurement signal, see e.g. the published patent application DE 103 20 520 A1 and the prior art specified therein.

In the present case, for the sake of simplicity, the term optical scattering disk is intended to encompass not only the purely light-scattering type, in which the frequency or wavelength of the radiation does not change as a result of the scattering process, but also the fluorescent or frequency-converting type, in which the impinging light is absorbed by the light-scattering-active particles and emitted homogeneously at a different frequency or wavelength. This type of scattering disk is also referred to as a quantum converter type. Such frequency-converting scattering disks are used e.g. to convert imaging radiation from the non-visible wavelength range to the visible wavelength range or to a wavelength range which is suitable for detection by means of customary detectors, such as CCD cameras. In order to realize frequency-converting scattering disks, a transparent solid substrate is provided with a frequency-converting surface coating made from a quantum converter material; by way of example, a quartz substrate with a P43 coating converts UV light into green light, or the substrate itself comprises such a material, for which, inter alia, suitably doped glass materials, cerium-doped quartz material and Lumilas are customary.

In applications where there is a desire to effect frequency conversion and the generation of a secondary image with high quality, that is to say with little washing out, the conversion process must be endeavored to be effected in a layer that is as thin as possible. In applications which use UV, DUV or VUV radiation, scattering disks in the form of quartz plates with a layer of P43 material a few micrometers thick are used for this purpose, by way of example. This frequency converting light scattering layer, viewed microscopically, typically comprises an accumulation of grains or powder particles of the frequency converter material, that have sedimented onto the relevant substrate surface. The particles naturally do not make contact with the substrate surface over the whole area, but rather with a relatively small contact area, so that gaps between adjacent particles remain in which an ambient medium, generally air, rather than frequency converter material directly adjoins the substrate surface. This means a local variation of the angle of total reflection viewed microscopically with regard to the optical behavior of the substrate/light scattering layer interface. In other words, radiation which is incident through the substrate onto the interface within gap regions, that is to say onto a substrate/air interface region, is subjected to total reflection at the interface without reaching the light-scattering-active particles if the angle of incidence exceeds the associated angle of total reflection. In the present case, the term angle of total reflection is understood to mean, in simplified fashion, the critical angle of total reflection. Consequently, such conventional scattering disks are only suitable for applications with apertures which are smaller than the angle of total reflection of the substrate/air interface.

Recently, projection objectives having a very high numerical aperture of e.g. greater than 0.9 or else greater than 1.0 have increasingly been used in microlithography for semiconductor wafer patterning, e.g. in the form of so-called immersion objectives, combined with the use of UV radiation having increasingly shorter wavelengths of e.g. only a few tens of nm. Determining the imaging aberrations or the imaging quality of such high-aperture objectives requires measurement apparatuses e.g. of the wavefront measurement type which are able to deal with the correspondingly large angles of incidence of such high-aperture test specimens.

Therefore, the technical problem on which the invention is based is that of providing an optical scattering disk of the type mentioned in the introduction and also a use thereof and a wavefront measuring apparatus equipped with such a scattering disk which are suitable even for comparatively high-aperture applications and in particular even for the measurement of high-aperture immersion objectives in microlithography.

The invention solves this problem by providing an optical scattering disk as herein described and/or claimed, a use thereof, an associated wavefront measuring apparatus, and an associated microlithography projection exposure apparatus.

In the case of the optical scattering disk according to the invention, the light-scattering-active particles of the light scattering layer are surrounded by an embedding medium which is optically denser than air and areally (contiguously) adjoins the facing surface of the substrate. Consequently, the embedding medium fills any gap regions between light-scattering-active particles at the interface with the substrate and ensures that the angle of total reflection is greater in comparison with the substrate/air interface or the total reflection effect completely disappears if the embedding medium has a refractive index greater than or equal to that of the substrate material.

Since, in this way, in the case of the optical scattering disk according to the invention, the total reflection effect is eliminated or in any event occurs only at higher angles of incidence compared with substrate/air gap regions, the possible area of use of this optical scattering disk is extended in the direction of higher permitted angles of incidence in comparison with conventional optical scattering disks in which air forms the medium surrounding the light-scattering-active particles. The optical scattering disk according to the invention can therefore be used in particular in apparatuses for imaging-aberration-determining measurement of high-aperture microlithography projection objectives, e.g. those of the immersion type.

In one refinement of the invention, the refractive index of the embedding medium amounts to at least approximately 80% or even at least approximately 90% of the refractive index of the substrate, and it may, in particular, also be greater than or equal to the latter. In addition or as an alternative, the refractive index of the embedding medium may be kept less than the refractive index of the light-scattering-active particles. This last then precludes total reflection effects at the interface between the embedding medium and a respective light-scattering-active particle.

In a further refinement of the invention, the light-scattering-active particles comprise a granular material having, as required, purely scattering, frequency-conversion-free properties or quantum converter properties.

In a further refinement of the invention, the embedding medium is a liquid material or a solid material in which the particles are embedded. In the case of a liquid embedding medium, the particles may be present in suspension or dissolved, or they may form a solid and/or baked and/or porous composite around which the fluid flows. In all cases the embedding medium fills any gap regions between the light-scattering-active particles at the interface with the substrate in the desired manner.

In a further refinement of the invention, the embedding medium is chosen with regard to the material such that its refractive index leads to a desired angle of total reflection for the substrate/embedding medium interface.

The embedding medium may be for example a liquid which holds by adhesion at the substrate, so that a container that takes up the embedding medium may be obviated. As an alternative, the liquid embedding medium is encapsulated, that is to say taken up by a suitable container. In the last-mentioned case, the embedding medium may be taken up in stationary or flowing fashion in the cavity.

In a further refinement of the invention, the particles are present in loose, mobile form in the embedding medium. As an alternative, they may be present in bound form attached to a particle carrier substrate.

In the case of loose, mobile particles, in one advantageous development of the invention, a device for the movement of the particles is provided. A movement of the light-scattering-active particles may increase the homogeneity of the scattered radiation. In order to effect the movement of the particles, the device may comprise a unit for the active flow movement of the fluid embedding medium and/or for the active movement of the particles themselves, that is to say relative to the fluid embedding medium, and/or for the active movement of auxiliary particles additionally taken up in the embedding medium. In the former case, the light-scattering-active particles are entrained by the flowing embedding medium. In the second case, the device exerts motive forces on the particles themselves, it being possible for the embedding medium to remain stationary or the embedding medium likewise moving. In the last-mentioned case, the movement of the light-scattering-active particles is instigated by moving auxiliary particles introduced into the embedding medium for this purpose. The auxiliary particles may be, by way of example, particles made from a material which is specially designed to enable the movement-activating device to apply a motive force to it in a relatively straightforward manner. The auxiliary particles can be chosen arbitrarily as required in terms of their form and size.

The interferometric wavefront measuring apparatus according to the invention, by means of which a test specimen can be measured by lateral shearing interferometry, for example, uses a scattering disk according to the invention between a diffraction grating and a detector element. In this case, the diffraction grating may be provided on a surface of the scattering disk substrate opposite to the light scattering layer, or on its own grating substrate adjoined by the scattering disk substrate. The wavefront measuring apparatus may for example also be designed as a point diffraction interferometer or as a Shack-Hartmann sensor. The test specimen may in particular be a microlithography projection objective.

In one development of the invention, an immersion medium is provided between the diffraction grating and the test specimen, as a result of which the maximum numerical aperture of the test specimen that can be dealt with by the measuring apparatus can be increased still further.

In a further refinement of the wavefront measuring apparatus, the light scattering layer is in touching contact with the detector element. Therefore, there is no need to take account of any further intervening optical media for the behavior of the radiation emitted by the scattering disk. Moreover, the detector element on the relevant scattering disk side may serve as a boundary for the embedding medium if a liquid is chosen for the latter. In an alternative refinement of the invention, the light scattering layer is held by adhesion at a detector-side surface of the scattering disk substrate, on whose opposite surface the diffraction grating is provided. The detector element is then arranged at a distance from the light scattering layer, e.g. with interposition of a detection imaging optic.

In the microlithography projection exposure apparatus of the invention the optical scattering disk of the invention is arranged at the radiation output side of a projection objective at least for given time intervals, where a projection objective may be one having a high aperture of e.g. 0.9 or more and/or may be designed for operating with an immersion medium, preferably an immersion fluid.

Figure 2:
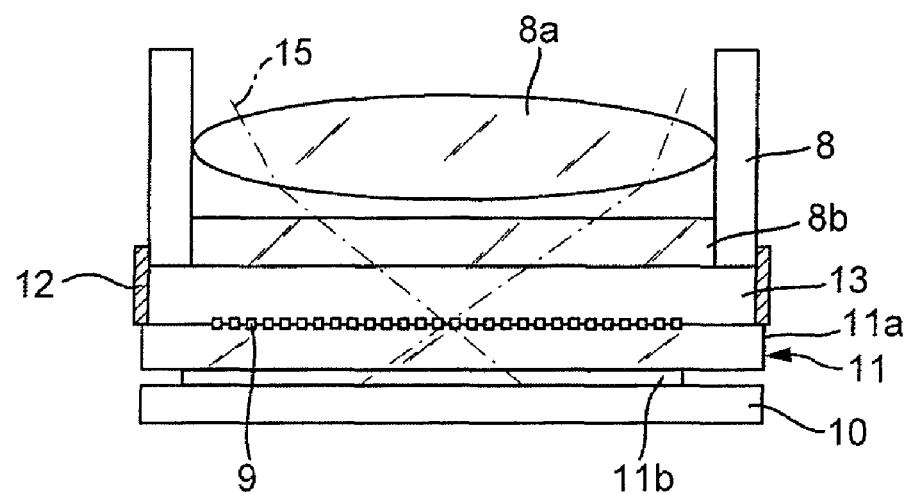
Figure 3:
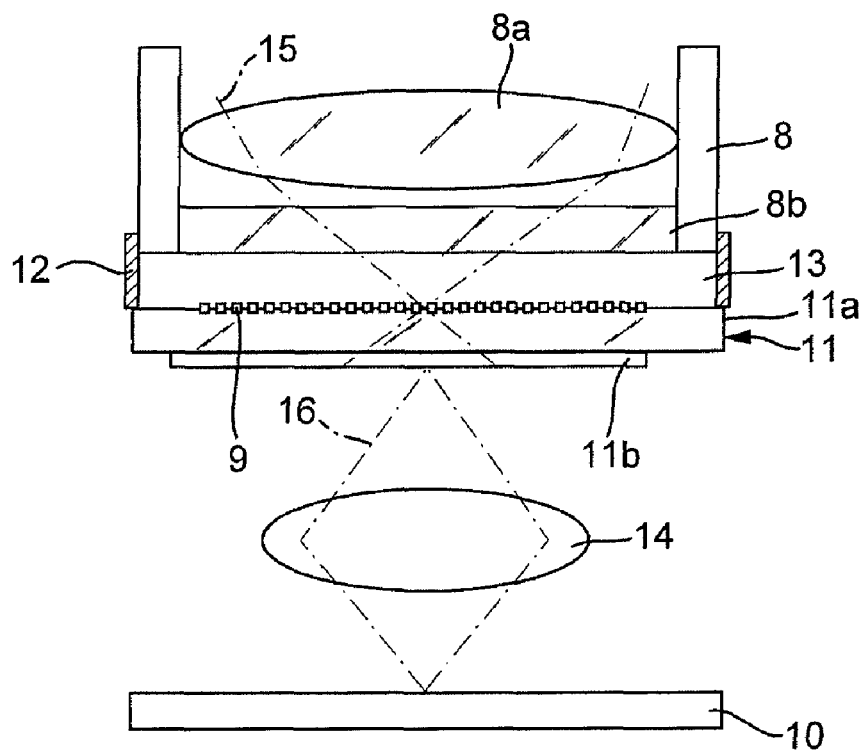
Figure 4:
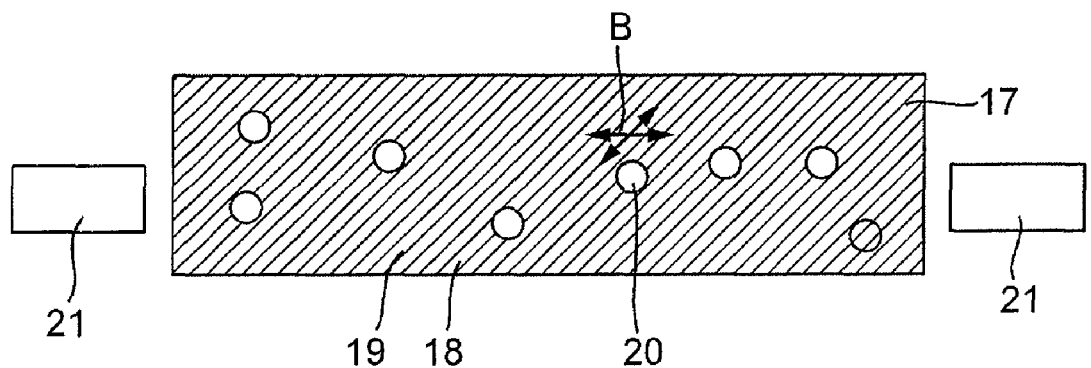

Advantageous embodiments of the invention are illustrated in the drawings and are described below. In the drawings:

FIG. 1 shows a schematic cross-sectional view of a scattering disk arrangement comprising a light scattering layer having light-scattering-active particles and an embedding medium which has a higher refractive index than air and surrounds said particles, FIG. 2 shows a cross-sectional view of a detector-side part of a wavefront measuring apparatus comprising a scattering disk arrangement in the manner of FIG. 1, the light scattering layer of which is in touching contact with a detector element, FIG. 3 shows a cross-sectional view of a detector-side part of a wavefront measuring apparatus comprising a scattering disk arrangement in the manner of FIG. 1, the light scattering layer thereof being held by adhesion at a combined diffraction grating/scattering disk substrate at a distance from a detector element, and FIG. 4 shows a schematic cross-sectional view of a light scattering layer with a fluid embedding medium and a particle movement device.

The scattering disk arrangement shown in FIG. 1 comprises a substrate 1 formed from a transparent material and a light scattering layer 2 adjoining said substrate on a main side and having light-scattering-active particles 3, which are represented in enlarged fashion for illustration purposes. The light-scattering-active particles 3 are surrounded by an embedding medium 4 of the light scattering layer 2, that is to say are embedded in said embedding medium. The embedding medium 4 may be a gaseous, liquid or solid medium which is optically denser than air. In the example shown, a material having a refractive index which is approximately equal in magnitude to the refractive index of the material for the substrate 1 is chosen for the embedding medium 4.

The embedding medium 4 fills all interspaces between the light-scattering-active particles 3 and consequently areally (contiguously) adjoins the substrate 1 wherever there is no contact between the substrate 1 and one of the particles 3, which, on account of their typical rounded small grain form, adjoin against the substrate 1 with at most a small contact area. It is thereby ensured that any radiation which passes through the substrate 1 does not undergo total reflection at the substrate/light scattering layer interface 5, independently of the angle of incidence.

This is illustrated in FIG. 1 on the basis of three representative light beams 6a, 6b, 6c. Part of the radiation directly impinges on a light-scattering-active particle at the substrate/light scattering layer interface 5, the light beam 6a in the example of FIG. 1. This radiation portion then directly enters the respective light-scattering-active particles without further significant losses and is scattered by said particles, and depending on the material is also subjected to frequency conversion. In corresponding embodiments, the refractive index of the light-scattering-active particles 3 has a magnitude similar to or greater than that of the substrate material, so that no appreciable total reflection effects occur. In any event the latter are not higher than in the case of corresponding conventional scattering disks even if the particles 3 comprise a material having a refractive index which is somewhat lower than that of the substrate material. At the substrate/light scattering layer interface 5, an appreciable radiation portion does not impinge directly on a light-scattering-active particle, but rather on the embedding medium 4. In the case of perpendicular incidence, the light beam 6b in FIG. 1, total reflection does not occur, and the radiation passes to the greatest possible extent unattenuated into the light scattering layer 2 until it impinges on a light-scattering-active particle therein and is scattered by said particle, the scattering behavior of the particles being symbolized by corresponding arrows in this and in the other two light beam examples. Reflection at the substrate/light scattering layer interface 5 can be minimized as required in a customary manner by means of an antireflection coating at said interface 5.

Characteristically, radiation which impinges at comparatively large angles of incidence on the substrate/light scattering layer interface 5 at a location not occupied by a light-scattering-active particle also passes into the light scattering layer 2 without total reflection losses on account of the refractive index coordination between the embedding medium 4 and the substrate 1, and in said light scattering layer it in turn impinges on a light-scattering-active particle 3 and is scattered by the latter; in this respect, see the light beam 6c. Even if, in specific embodiments, the refractive index of the embedding medium 4 is less than that of the substrate 1, it is in any event greater than that of air, so that, in contrast to conventional scattering disks without such an embedding medium which is optically denser than air, that radiation portion which is incident at angles in the range between the substrate/air angle of total reflection and the substrate/embedding medium angle of total reflection, is also still coupled into the light scattering layer 2.

In principle all materials having a refractive index greater than that of air are suitable for the embedding medium 4, said materials being as transparent as possible both to the incident radiation and to the scattered, emitted and, if appropriate, frequency-converted radiation. In the case of a solid embedding medium 4, the particles 3 are fixed, that is to say as it were cast, therein. For many applications it is favorable to choose a liquid embedding medium 4, which may be chosen with its refractive index adapted to an angle of total reflection required by the desired application. Appropriate liquids are water or Fomblin, by way of example, if UV or DUV radiation is involved. In the case of radiation at other wavelengths, e.g. oils such as are used as an immersion medium in immersion microscopy can be used for the embedding medium 4.

If required, the embedding medium 4 may also be designed for fulfilling a filter function for the angular spectrum of the radiation passing into the light scattering layer 2, that is to say that a specific difference in refractive index between the substrate 1 and the then optically less dense embedding medium 4 is chosen in a targeted manner such that only radiation which is incident on the light scattering layer 2 at an angle of incidence up to at most the relevant angle of total reflection is coupled into the light scattering layer 2 in a desired manner.

For the light-scattering-active particles 3, all materials which are customary therefor can be used, in particular those having a purely scattering behavior without frequency conversion, e.g. a glass or quartz granular material, and those having a fluorescent, quantum-converting behavior, such as P43 material, correspondingly doped glass materials, cerium-doped quartz material, Lumilas material, etc.

The particles 3 may be transparent and/or have reflective properties, depending on the application and as required. The dimensioning and shape of the particles 3 are likewise arbitrary depending on the application. Thus, the particles 3 may e.g. be of essentially identical size and have an identical type of geometry or alternatively may vary in their properties, e.g. finer and/or coarser grains, particles having a smoother or rougher surface, more rounded or more angular grains, etc. The particles may be present separately or in agglomerated form and, with the use of a fluid embedding medium 4, may be present in the latter loosely or in bound form, that is to say in freely mobile fashion or attached to a particle carrier substrate or in or on a particle carrier structure. What is essential in any case is the uninterrupted embedding and wetting of the particles 3 by the embedding medium 4 on the side facing the direction of incidence, that is to say the substrate 1.

When a fluid embedding medium 4 is chosen, this medium in corresponding exemplary embodiments together with the particles 3 and thus the light scattering layer 2 overall can be held solely by adhesion at the substrate 1. As an alternative, the fluid embedding medium 4 is suitably encapsulated, e.g. using a container or by introduction into a gap. This last is indicated in the example of FIG. 1 in that here the light scattering layer 2, on its side remote from the substrate 1, is delimited by a transparent component 7 disposed downstream in the beam path, said component being any desired, e.g. optical component which is positioned at this location in the respective application. It goes without saying that in the case of a fluid embedding medium 4, the latter may, as required, also be delimited in a suitable manner at the remaining sides of the light scattering layer 2, if necessary. The fluid embedding medium 4 may, depending on the requirement, remain in stationary fashion or be caused to flow, e.g. flushed. If such a flow of the embedding medium 4 is effected and the particles 3 are taken up in freely mobile fashion in the embedding medium 4, the particles 3 are entrained by the flow of the embedding medium 4, thereby enabling a temporal variation of the scattering properties of the light scattering layer 2 to be obtained, which leads to an effect equivalent to the mechanical movement of a conventional scattering disk.

The scattering disk according to the invention is capable of broad application by virtue of its action of reducing or entirely avoiding total reflection effects at the substrate/light scattering layer interface. In particular, it can be used wherever conventional scattering disks have been used hitherto, and, moreover, it is suitable for applications in which radiation to be scattered is incident on the scattering disk at high angles of incidence. One important area of application is the measurement of high-aperture optical systems, such as high-aperture projection objectives of microlithography projection exposure apparatuses. FIGS. 2 and 3 illustrate two exemplary embodiments in this regard.

More precisely, FIGS. 2 and 3 show a detector-side part of interest here in a respective wavefront measuring apparatus using lateral shearing interferometry. For the rest, the respective apparatus is of a customary construction, which is therefore not shown in any greater detail. In FIGS. 2 and 3, the test specimen to be measured is shown in each case as a high-aperture immersion objective 8 as is used e.g. in microlithography projection exposure apparatuses of the scanner or stepper type for semiconductor wafer patterning with short-wave UV radiation. FIG. 2 illustrates only the exit-side part of the objective 8 comprising a lens 8a and a plane terminating element 8b. This is followed by a detector-side or image-side part of the measuring apparatus, which comprises, in a manner known per se, a diffraction grating 9 positioned in or near an image plane of the objective 8 and a radiation-sensitive detector element 10, e.g. a CCD array, positioned at a small distance behind it.

A scattering disk 11 according to the invention of one of the types described above with reference to FIG. 1 is introduced between the diffraction grating 9 and the detector element 10. In this case, a common, combined grating/scattering disk substrate 11a simultaneously serves as a substrate of a light scattering layer 11b, which corresponds to the light scattering layer 2 from FIG. 1, and as a substrate for the diffraction grating 9. Specifically, the diffraction grating 9 is situated on the main side of the common carrier substrate 11a facing the objective 8, while the light scattering layer 11b is in touching contact with the radiation-sensitive detector element 10 on the opposite main side of the common carrier substrate 11a. Optionally, a lateral boundary may be provided for the light scattering layer 11b if necessary, in a manner that is not shown in greater detail, if the embedding medium of said layer is a fluid. As an alternative to the example shown, it is also possible to provide in each case a dedicated substrate for the diffraction grating, on the one hand, and the light scattering layer, on the other hand, which are then arranged e.g. with touching contact one behind the other.

The interspace between the objective 8 and the combined grating/scattering disk substrate 11 is encapsulated by a suitable sealing ring 12 in the lateral direction and filled with an arbitrary suitable immersion medium, e.g. water. The plane terminating element 8b of the objective 8, on the one hand, and the combined grating/scattering disk substrate 11a, on the other hand, serve as axial boundaries for the immersion medium.

FIG. 3 shows, in a view analogous to FIG. 2, the image-side or detector-side part of a further wavefront measuring apparatus of the lateral shearing interferometry type, which corresponds to that from figure 2 unless stated otherwise below. For the sake of simplicity, the same reference symbols as in FIG. 2 are used in FIG. 3 for functionally equivalent components, so that reference may be made to the above description concerning FIG. 2 in this respect. The measuring apparatus from FIG. 3 differs from that from FIG. 2 primarily in that the radiation-sensitive detector element 10 is arranged at a distance from the scattering disk 11, that is to say, to put it more precisely, from the light scattering layer 11b thereof, a detection imaging optic 14 being provided between the light scattering layer 11b and the detector element 10. In this exemplary embodiment, the light scattering layer 11b adheres like a flat drop by adhesion at the combined diffracting grating/scattering disk substrate 11a and therefore need not be enclosed in a container. The fluid embedding medium of the light scattering layer 11b is chosen in a suitable manner for this purpose. Thus, for example when Fomblin is used as the embedding medium for the light-scattering-active particles, owing to its extremely low vapor pressure, the loss of liquid through evaporation is negligibly small even over a number of months. Therefore, it is not necessary for the embedding fluid to be frequently replenished or exchanged.

In the case of the apparatus from FIG. 3, the imaging optic 14 images the shearing interferogram that arises as a secondary image in the light scattering layer 11b of the scattering disk 11 onto the detector element 10, while in the exemplary embodiment of FIG. 2 the detector element 10 taps off said secondary image directly at the light scattering layer 11b by virtue of being in touching contact with the latter. In contrast to this, in the case of FIG. 3, the scattering disk 11 is adjacent to the ambient medium, typically air, with its light scattering layer 11b on its side remote from the diffraction grating. In both exemplary embodiments, the light scattering layer 11b may comprise, by way of example, light-scattering particles made of a quantum converter material in order that incident UV measurement radiation 15 is not only scattered but at the same time converted into radiation 16 of a different wavelength range, which can be better detected by the detector element 10.

Both in the example of FIG. 2 and in the example of FIG. 3, the measuring apparatus is suitable for measuring even a very high-aperture test specimen 8 in which correspondingly high angles of incidence of the radiation 15 onto the scattering disk 11 and in particular the interface between scattering disk substrate 11a and light scattering layer 11b occur. Even at these high angles of incidence, total reflections are kept acceptably small or completely avoided at said interface. For this purpose, the refractive index of the embedding medium is suitably adapted to the refractive index of the scattering disk substrate 11a, as explained extensively above with respect to FIG. 1.

The scattering disk according to the invention may be used e.g. in the applications of FIGS. 2 and 3, but also in cases of measuring apparatuses of any other type and generally in any other scattering disk applications as a solid-state scattering disk with a solid embedding medium for the light-scattering-active particles or as a fluid scattering disk with a fluid embedding material, as mentioned above with respect to FIG. 1. In the last-mentioned case, the light-scattering-active particles, individually or joined to form relatively large agglomerates, may be freely mobile in the surrounding fluid embedding medium. This may be utilized as required to produce an intentional movement of the light-scattering-active particles and, as a result, a temporal variation of the scattering properties of the light scattering layer analogously to the effect of a mechanically moved conventional scattering disk.

There are various possibilities for such movement of the light-scattering-active particles. One possibility consists in moving the fluid embedding medium itself, that is to say causing it to flow, for example by flushing, stirring or the like. The flow movement of the embedding fluid entrains the embedded light-scattering-active particles. The movement of the light-scattering-active particles may also be effected in that, by means of a corresponding device, externally a motive force is exerted on said particles or a motive force is exerted on auxiliary particles additionally introduced into the embedding fluid. By way of example, electrical or magnetic force actions are taken into consideration as a mechanism for generating such motive forces. The movement of auxiliary particles which then in turn initiate a movement of the light-scattering-active particles may also be driven by a flow movement of the embedding fluid, e.g. by convection. Any types of movement are possible depending on the requirement, such as periodic, uniform or statistical movements. As movement activation mechanism, consideration is also given to producing movement by means of sound waves or local hot spots which are produced e.g. by focused radiation introduced in a pulsed manner or in some other manner.

FIG. 4 schematically shows an exemplary embodiment with external electromagnetic movement activation in the case of a light scattering layer 17 of a fluid scattering disk, the rest of which is not shown in further detail, the light scattering layer 17 having a fluid embedding material 18 and light-scattering-active particles 19 that are freely mobile in said embedding material. In addition, magnetic auxiliary particles 20 have been introduced into the embedding medium 18 of the light scattering layer 17, said auxiliary particles being significantly larger than the light-scattering-active particles 19 in this example. The magnetic auxiliary particles 20 are part of a movement-activating device, which furthermore has an electromagnet arrangement 21 positioned laterally with respect to the light scattering layer 17. Through activation of the electromagnet arrangement 21, it is possible, in a manner known per se, for electromagnetic forces to be exerted in pulsed or some other form on the magnetic auxiliary particles 20 freely suspended in the embedding medium 18, which particles are thereby set in motion, as indicated by the arrows B. The e.g. pulsed or random movement of the magnetic auxiliary particles 20 which is brought about as a result has the effect that the light scattering particles 19 freely suspended in the embedding fluid 18 are also set in motion and intermixed. As required, this movement activation of the light-scattering-active particles 19 may additionally be supported by a flow movement of the embedding fluid 18.

As made clear by the exemplary embodiments explained above, the invention provides an optical scattering disk which is suitable even for high angles of incidence of the radiation to be scattered in that total reflection effects at an interface with a scattering disk substrate are reduced or entirely avoided by means of a suitably chosen embedding medium for the light-scattering-active particles.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An optical scattering disk comprising:
a transparent substrate and
a light scattering layer adjoining a surface of the substrate and comprising light-scattering-active particles, wherein:
the light scattering layer has an embedding medium which is optically denser than air and contiguously adjoins the surface of the substrate, and which surrounds the light-scattering-active particles,
the light-scattering-active particles are formed from a granular quantum converter material, and
the embedding medium is a fluid which is held by adhesion at the substrate or which is encapsulated.

2. The optical scattering disk as claimed in claim 1, wherein the refractive index of the embedding medium is at least one of: (i) at least approximately 80% of the refractive index of the substrate, and (ii) less than the refractive index of the light-scattering-active particles.

3. The optical scattering disk as claimed in claim 1, wherein the embedding medium has a refractive index adapted to a predetermined angle of total reflection of an interface between the substrate and the embedding medium.

4. The optical scattering disk as claimed in claim 1, wherein the embedding medium is supported in a cavity either in a stationary or in a flowing state.

5. The optical scattering disk as claimed in claim 1, wherein the light scattering layer contacts the surface of the substrate across an unbroken contact area.

6. The optical scattering disk as claimed in claim 1, wherein the light scattering layer fills all gap regions between the surface of the substrate and the light-scattering active particles.

7. An optical scattering disk, comprising:
a transparent substrate and
a light scattering layer adjoining a surface of the substrate and comprising light-scattering-active particles, wherein:
the light scattering layer has an embedding medium which is optically denser than air and contiguously adjoins the surface of the substrate, and which surrounds the light-scattering-active particles,
the light-scattering-active particles are formed from a granular quantum converter material, and
the embedding medium is a fluid material and wherein the light-scattering-active particles are present in suspension or dissolved in the fluid embedding medium or form at least one of a solid, baked or porous composite around which the fluid embedding medium flows.

8. An optical scattering disk, comprising:
a transparent substrate and
a light scattering layer adjoining a surface of the substrate and comprising light-scattering-active particles, wherein:
the light scattering layer has an embedding medium which is optically denser than air and contiguously adjoins the surface of the substrate, and which surrounds the light-scattering-active particles,
the light-scattering-active particles are formed from a granular quantum converter material, and
the light-scattering-active particles are surrounded by the embedding medium in mobile form.

9. The optical scattering disk as claimed in claim 8, wherein the light-scattering-active particles are in mobile form in a fluid embedding medium, and further comprising a device moving the light-scattering-active particles.

10. The optical scattering disk as claimed in claim 9, wherein the particle-moving device comprises at least one of: (i) a unit imparting active flow movement to the fluid embedding medium, (ii) a unit imparting active movement to the light-scattering-active particles, and (iii) a unit imparting active movement to auxiliary particles additionally provided in the embedding medium.

11. An apparatus for imaging-aberration-determining measurement of an optical test specimen with radiation, comprising:
a diffraction grating for the radiation,
a support configured to position the test specimen in fixed relation to the diffraction grating and in a path of the radiation,
an optical scattering disk also in the path of the radiation and comprising a transparent substrate and a light scattering layer adjoining a surface of the substrate and comprising light-scattering-active particles, and
a detector element sensitive to the radiation, wherein the light scattering layer has an embedding medium which is optically denser than air and contiguously adjoins the surface of the substrate, and which surrounds the light-scattering-active particles, and wherein the light scattering-active particles are formed from a granular quantum converter material.

12. An apparatus for interferometric wavefront measurement of a test specimen, comprising:

a diffraction grating arranged downstream of the test specimen in a measurement beam path, a detector element arranged downstream of the diffraction grating, and an optical scattering disk arranged between the diffraction grating and the detector element, and comprising:

a transparent substrate and a light scattering layer adjoining a surface of the substrate and comprising light-scattering-active particles, wherein the light scattering layer has an embedding medium which is optically denser than air and contiguously adjoins the surface of the substrate, and which surrounds the light-scattering-active particles, and wherein the diffraction grating is provided on a surface of the scattering disk substrate opposite to the light scattering layer or on a grating substrate adjoined by the scattering disk substrate.

13. The apparatus as claimed in claim 12, configured as a lateral shearing interferometer.

14. The apparatus as claimed in claim 12, configured as a point diffraction interferometer.

15. The apparatus as claimed in claim 12, configured as a Shack-Hartmann sensor.

16. The apparatus as claimed in claim 12, wherein the scattering disk is in touching contact with the detector element via the light scattering layer.

17. The apparatus as claimed in claim 12, wherein the light scattering layer of the scattering disk is spaced apart from the detector element and is held by adhesion at a detector-side surface of a common substrate of the grating and the scattering disk, and wherein the diffraction grating is provided on the surface facing the test specimen.

18. The apparatus as claimed in claim 12, further comprising an immersion medium between the diffraction grating and the test specimen.

19. The apparatus as claimed in claim 12, wherein the test specimen is a microlithography projection objective.

20. Microlithography projection exposure apparatus comprising a projection objective and an optical scattering disk arranged at a radiation output side of the projection objective, wherein the optical scattering disk comprises:

a transparent substrate and a light scattering layer adjoining a surface of the substrate and comprising light-scattering-active particles, wherein:

the light scattering layer has an embedding medium which is optically denser than air and contiguously adjoins the surface of the substrate, and which surrounds the light-scattering-active particles, and the light-scattering-active particles are formed from a granular quantum converter material.

21. Microlithography projection exposure apparatus as claimed in claim 20, wherein the projection objective has a numerical aperture at a radiation output side thereof of at least 0.9.

22. Microlithography projection exposure apparatus as claimed in claim 21, wherein the projection objective has a numerical aperture at a radiation output side thereof of at least 1.0.

23. Microlithography projection exposure apparatus as claimed in claim 20, wherein the projection objective is configured as an immersion objective.

* * * * *

UNITED STATES PATENT AND TRADEMARK OFFICE
CERTIFICATE OF CORRECTION

PATENT NO.        : 8,199,333 B2
APPLICATION NO.   : 11/915705
DATED             : June 12, 2012
INVENTOR(S)       : Ulrich Wegmann It is certified that error appears in the above-identified patent and that said Letters Patent is hereby corrected as shown below:

Column 11, Line 5: In Claim 11, delete "light scattering-active particles" and insert -- light-scattering-active particles -- therefor.

Signed and Sealed this
Sixth Day of November, 2012

David J. Kappos
*Director of the United States Patent and Trademark Office*